(12) United States Patent
Yoshida et al.

(10) Patent No.: US 6,465,821 B2
(45) Date of Patent: Oct. 15, 2002

(54) SOLID STATE IMAGE SENSING DEVICE

(75) Inventors: Toshio Yoshida, Sakurai (JP); Yoshinori Kamada, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 64 days.

(21) Appl. No.: 09/784,029

(22) Filed: Feb. 16, 2001

(65) Prior Publication Data

US 2001/0032988 A1 Oct. 25, 2001

(30) Foreign Application Priority Data

Feb. 17, 2000 (JP) ........................................ 2000-039472

(51) Int. Cl.[7] .......................... H01L 27/148; H01L 21/00
(52) U.S. Cl. ........................ 257/223; 257/226; 257/229; 257/233; 257/435; 438/48
(58) Field of Search ................................. 257/222, 223, 257/225, 226, 231, 232, 233, 431, 435, 229; 48/48, 69

(56) References Cited

U.S. PATENT DOCUMENTS

| | | | | | |
|---|---|---|---|---|---|
| 5,250,825 A | * | 10/1993 | Negishi et al. | ............. | 257/232 |
| 5,371,033 A | * | 12/1994 | Lee et al. | ..................... | 438/48 |
| 5,463,232 A | * | 10/1995 | Yamashita et al. | .......... | 257/223 |
| 5,585,653 A | * | 12/1996 | Nakashiba | .................. | 257/232 |
| 5,736,756 A | * | 4/1998 | Wakayama et al. | ......... | 257/223 |
| 5,929,470 A | * | 7/1999 | Harada et al. | ............... | 257/233 |
| 6,384,436 B1 | * | 5/2002 | Kudoh et al. | ................ | 257/231 |

FOREIGN PATENT DOCUMENTS

| | | | |
|---|---|---|---|
| EP | 495503 | * | 1/1992 |
| JP | 2001-189443 | * | 7/2001 |

* cited by examiner

*Primary Examiner*—Kamand Cuneo
*Assistant Examiner*—Alonzo Chambliss

(57) ABSTRACT

A CCD area sensor has an effective pixel region for detecting optical information of a subject and an ineffective pixel region for detecting optical black. On a light-receiving region in the ineffective pixel region, a light shielding film is provided with an opening portion. This enables hydrogen ions to be sufficiently diffused from a passivation film made of a P—SiN film toward a silicon substrate in a hydrogen annealing process even though the light shielding film is made of a material such as a high-melting point metal of TiW that is hard for hydrogen ions to penetrate. As a result, interface state densities in a light-receiving region and a transfer channel region are reduced, and a dark-time output voltage of the ineffective pixel region is reduced to be equivalent to that of the effective pixel region. Thus, no difference occurs between the effective pixel region and the ineffective pixel region in terms of the black level.

8 Claims, 4 Drawing Sheets

SOLID STATE IMAGE SENSING DEVICE

BACKGROUND OF THE INVENTION

The present invention relates to a solid state image sensing device, and in particular, to a solid state image sensing device that has an effective pixel region for detecting optical information of a subject and an ineffective pixel region for detecting optical black.

In general, as shown in FIG. 6, a CCD (charge coupled device) area sensor has an effective pixel region A for detecting optical information of a subject and an ineffective pixel region B for detecting optical black. Further, the ineffective pixel region B is normally provided on the right and left sides and upper and lower sides of the effective pixel region A.

FIG. 7 shows a sectional view of the effective pixel region A (corresponding to a cross section in an inner portion of the arrow line C–C' in FIG. 6) in a conventional CCD area sensor. FIG. 8 shows a sectional view of the ineffective pixel region B (corresponding to the cross section in an outer portion of the arrow line C–C' in FIG. 6). Pixel constructions of the effective and ineffective pixel regions in the conventional CCD area sensor are described below with reference to FIGS. 7 and 8.

As shown in FIG. 7, the effective pixel region A has a pixel construction such that a light-receiving region 3, a transfer channel region 4 and a read region 5 for transferring electric charges generated by photoelectric conversion in the light-receiving region 3 to the transfer channel region 4 are formed in a p-type impurity region 2 formed on an n-type silicon substrate 1. On top of the transfer channel region 4 and the read section 5, a transfer electrode 8 of a polysilicon film doped with phosphorus is selectively formed with interposition of a silicon oxide film 6 and a silicon nitride film 7.

Then, an insulating film 9 is formed of, for example, a silicon oxide film by CVD (chemical vapor deposition) on the entire surface including the transfer electrode 8. Further, a high-melting point metal 10 of, for example, TiW is selectively formed as a light shielding film so as to cover the region of the transfer electrode 8. A BPSG (boro-phospho silicate glass) film 11 is further formed on the entire surface including the high-melting point metal 10, and an wiring metal 12 of, for example, Al—Si is formed on this BPSG film 11 and thereafter selectively removed (the wiring metal 12 is removed in FIG. 7). Then, a surface protecting film 13 of, for example, a SiN film is formed by plasma CVD on the entire surface of the wiring metal 12.

On the other hand, as shown in FIG. 8 where the components corresponding to FIG. 7 are denoted by the same reference numerals, the pixel construction of the ineffective pixel region B is roughly equal to the pixel construction of the effective pixel region A. It is to be noted that the light-receiving region 3 is covered with the high-melting point metal 10 and the entire surface is covered with the wiring metal 12 in order to prevent light from entering the light-receiving region 3, dissimilar to the effective pixel region A.

However, the aforementioned conventional CCD area sensor has the disadvantages as follows. In general, hydrogen annealing is performed through the fabricating processes of the CCD area sensor. The hydrogen annealing has the effects of reducing the interface state densities of the light-receiving region 3 and the transfer channel region 4 and reducing a dark-time output voltage. Particularly in the effective pixel region A, the surface protecting film 13 contains a large amount of hydrogen, and the large amount of hydrogen is diffused from the surface protecting film 13 toward the silicon substrate 1. Therefore, the dark-time output voltage can be sufficiently reduced.

In the ineffective pixel region B, however, the high-melting point metal 10 and the wiring metal 12 are laminated on top of the light-receiving region 3. Therefore, the diffusion of hydrogen ions from the surface protecting film 13 constructed of an SiN film toward the silicon substrate 1 is not sufficiently effected, for which the dark-time output voltage is not reduced to such an extent as in the effective pixel region A.

For the above-mentioned reasons, there occurs a difference between the effective pixel region A and the ineffective pixel region B in terms of the black level. Then, signal processing is executed on the basis of the black level of the ineffective pixel region B used as a reference. Therefore, the signal processing is executed in a state in which the black at the reference level is shifted to the white side with respect to the black at the proper reference level, and this causes a disadvantage in gray scale accuracy.

SUMMARY OF THE INVENTION

Accordingly, an object of the present invention is to provide a solid state image sensing device that has no difference between the effective pixel region and the ineffective pixel region in terms of the black level.

In order to achieve the above-mentioned object, the present invention provides a solid state image sensing device that has a light-receiving section, a transfer channel section and a read section on an identical substrate and is separated into an effective pixel region for detecting optical information of a subject and an ineffective pixel region for detecting optical black, the device comprising: a first light shielding film that covers the transfer channel section and the read section in the effective pixel region and the ineffective pixel region and is arranged so as to provide an opening on the light-receiving section; an interlayer insulating film that is formed on the first light shielding film and the light-receiving section in the effective pixel region and the ineffective pixel region; a second light shielding film that is formed on the interlayer insulating film in at least the ineffective pixel region and is arranged so as to cover the light-receiving section, the transfer channel section and the read section in at least the ineffective pixel region; and a protective insulating film that is formed on the interlayer insulating film and the second light shielding film to cover their entire surface in the effective pixel region and the ineffective pixel region.

According to the above construction, the first light shielding film formed on the transfer channel section and the read section in the ineffective pixel region has an opening on the light-receiving section. Therefore, in the ineffective pixel region, if the second light shielding film that is arranged on the first light shielding film and covers the light-receiving section, the transfer channel section and the read section is formed of the material that is easy for hydrogen ions to penetrate, then the diffusion of hydrogen ions from the protective insulating film toward the substrate is sufficiently effected in the ineffective pixel region in the hydrogen annealing stage even though the first light shielding film is made of a material that is hard for hydrogen ions to penetrate, by which the interface state densities of the light-receiving section and the transfer channel section are reduced. As a result, the black level of the ineffective pixel region similarly becomes equivalent to the black level of the effective pixel region that has an opening on the light-receiving section of the first light shielding film, causing no difference.

The present invention also provides a solid state image sensing device that has a light-receiving section, a transfer channel section and a read section on an identical substrate and is separated into an effective pixel region for detecting optical information of a subject and an ineffective pixel region for detecting optical black, the device comprising: a first light shielding film that covers the transfer channel section and the read section in the effective pixel region and the ineffective pixel region and is arranged so as to provide an opening on the light-receiving section; an interlayer insulating film formed on the first light shielding film and the light-receiving section in the effective pixel region and the ineffective pixel region; a second light shielding film that is formed on the interlayer insulating film in at least the ineffective pixel region and is arranged so as to cover the light-receiving section and provide an opening in a region other than the light-receiving section; and a protective insulating film that is formed on the interlayer insulating film and the second light shielding film to cover their entire surface in the effective pixel region and the ineffective pixel region.

According to the above construction, the first light shielding film formed on the transfer channel section and the read section has an opening on the light-receiving section in the ineffective pixel region. Furthermore, the second light shielding film located on the first light shielding film covers the light-receiving section and has an opening in a region other than the light-receiving section in the ineffective pixel region. Therefore, even though the first light shielding film is made of a material that is hard for hydrogen ions to penetrate and the second light shielding film is made of a material that is hard for hydrogen ions to penetrate, then the diffusion of hydrogen ions from the protective insulating film toward the substrate is sufficiently effected in the ineffective pixel region in the hydrogen annealing stage because of the openings. As a result, the interface state densities of the light-receiving section and the transfer channel section are reduced.

In one embodiment of the invention, the second light shielding film is made of a metal film for wiring use.

According to the above construction, the wiring metal film functions as a second light shielding film. Accordingly, there is no need for providing the second light shielding film in addition to the first light shielding film, and this allows the reduction in thickness and cost of the solid state image sensing device.

In one embodiment of the invention, the metal film for wiring use is formed of a material that blocks penetration of hydrogen.

In one embodiment of the invention, the metal film for wiring use is formed of a laminate structure film that includes Ti or a Ti alloy.

According to the above construction, even though the wiring metal film is formed of the multi-layer structure film of the barrier metal that includes Ti or a Ti alloy and the reflection preventing film for the achievement of finer pixels, then the diffusion of hydrogen ions is sufficiently effected in the ineffective pixel region in the hydrogen annealing stage. As a result, the interface state densities of the light-receiving section and the transfer channel section are reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
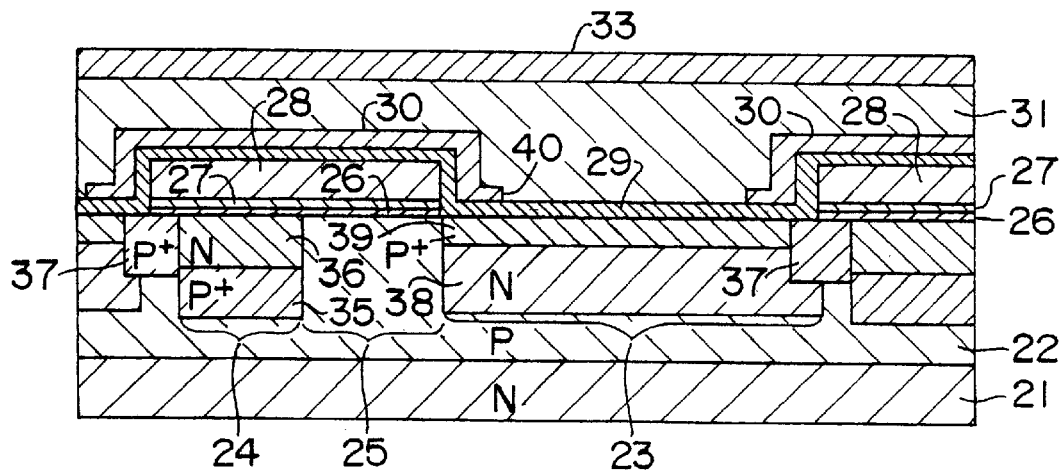
FIG. 1 is a sectional view of an effective pixel region in a CCD area sensor that serves as a solid state image sensing device of the present invention.

The present invention will be described in detail below on the basis of the embodiments thereof shown in the drawings.

First Embodiment

Figure 2:
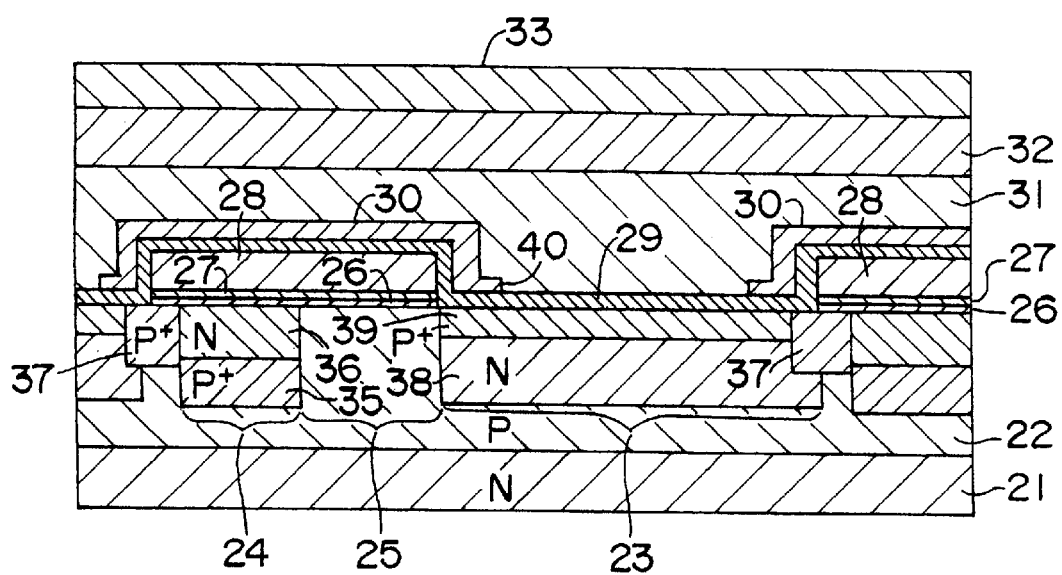
FIG. 2 is a sectional view of an ineffective pixel region corresponding to FIG. 1.
Figure 6:
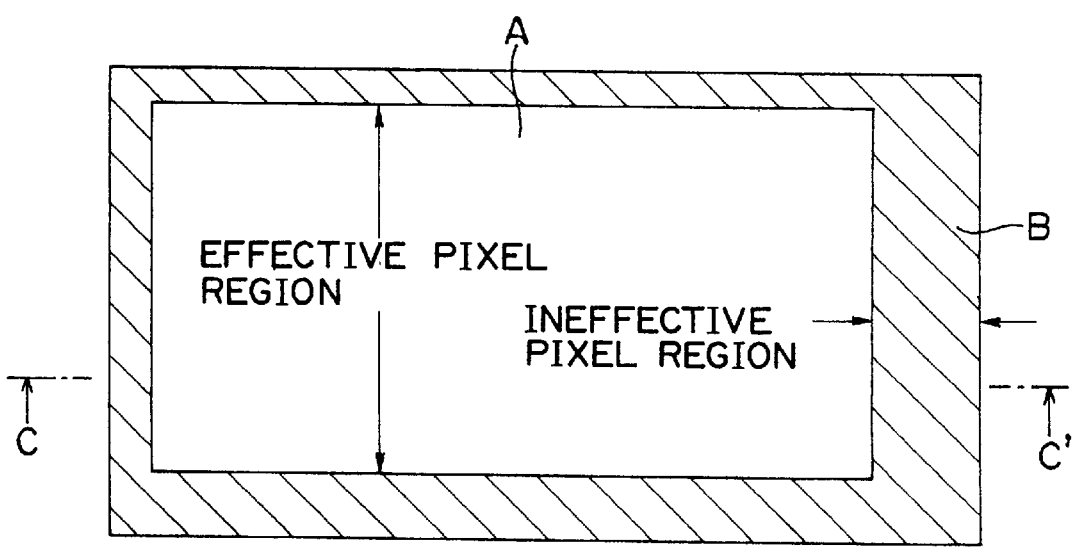
FIG. 6 is an explanatory view of an effective pixel region and an ineffective pixel region in a CCD area sensor.
Figure 7:
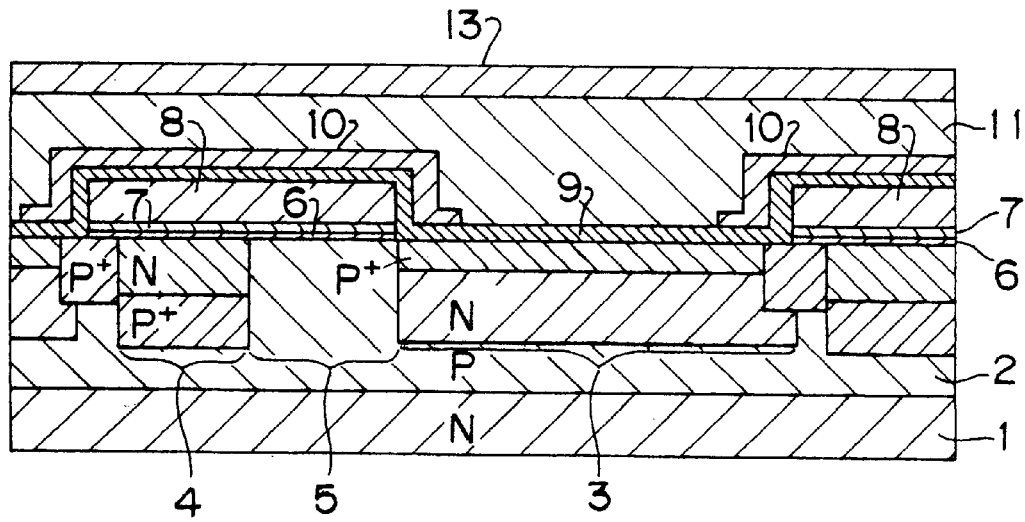
FIG. 7 is a sectional view of an effective pixel region in a conventional CCD area sensor.
Figure 8:
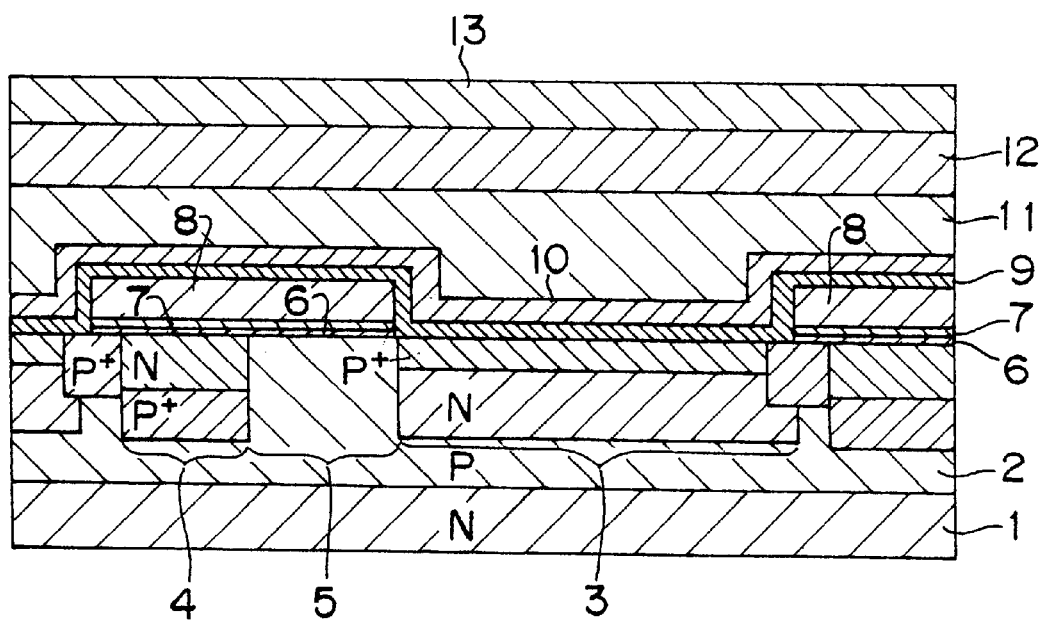
FIG. 8 is a sectional view of an ineffective pixel region corresponding to FIG. 7.

FIG. 1 shows a sectional view of the aforementioned effective pixel region A (corresponding to a cross section in an inner portion of the arrow line C–C' in FIG. 6) in a CCD area sensor that serves as a solid state image sensing device of the present embodiment. FIG. 2 shows a sectional view of the ineffective pixel region B (corresponding to a cross section in an outer portion of the arrow line C–C' in FIG. 6). In FIG. 1 and FIG. 2 are shown an n-type semiconductor substrate 21, a first p-type impurity layer 22, a light-receiving region 23, a transfer channel region 24, a read gate region 25, a silicon oxide film 26 that serves as a gate insulating film, a silicon nitride film 27 that serves as a gate insulating film, a polysilicon gate electrode 28, a silicon oxide film 29 that covers the entire surface including the polysilicon gate electrode 28, a light shielding film 30 constructed of a TiW film, a silicon oxide film 31 of BPSG or the like for flattening and insulating uses, an wiring metal film 32 constructed of an Al-Si film and a passivation film 33 of P—SiN or the like. The light-receiving region 23 and the transfer channel region 24 are formed inside the first p-type impurity layer 22.

The CCD area sensor having the above-mentioned structure is formed as follows. First, boron ions are implanted into the entire surface of the n-type silicon substrate that serves as the n-type semiconductor substrate 21, and thereafter thermal diffusion is performed to form a first p-type well layer that serves as the first p-type impurity layer 22. Next, a window is opened by means of a photoresist in a region which belongs to the first p-type well layer 22 and in which the transfer channel region 24 is to be formed. Then, boron ions and phosphorus ions are successively implanted, so that the transfer channel region 24 and the n-type impurity layer 36 are thus formed to constitute a second p-type impurity layer (second p-type well layer) 35. After removing the photoresist, a window is opened by means of a photoresist in a region which belongs to the first p-type well layer 22 and is located between the transfer channel region 24 and the light-receiving region 23. Then, boron ions are implanted to form a p-type channel stop layer 37.

Next, after removing the photoresist, thermal oxidation is performed to form the silicon oxide film 26 that serves as a gate insulating film, and the silicon nitride film 27 is formed as a gate insulating film by CVD. Further, a polysilicon film is deposited by CVD, and thereafter, phosphorus doping is performed by the solid phase thermal diffusion method (POCl₃ method) that uses POCl₃ as a diffusion source. A region in which the polysilicon gate electrode 28 is to be formed is covered with a photoresist, and reactive ion etching is performed to remove the phosphorus doped polysilicon film and the silicon nitride film 27 for the formation of the polysilicon gate electrode 28.

Normally, in the CCD area sensor, the polysilicon gate electrode 28 is so made as to have a 2-layer structure or a 3-layer structure. In this case, after removal of the photoresist, in order to provide insulation between the polysilicon gate electrode of the first layer and the polysilicon gate electrode of the second layer, an interlayer oxide film is formed on the polysilicon gate electrode of the first layer by thermal oxidation. The polysilicon gate electrode of the second layer is formed similarly to the polysilicon gate electrode of the first layer. If the polysilicon gate electrode of a third layer is formed, an interlayer oxide film and a polysilicon gate electrode are formed again in a similar manner.

Next, a window is opened by means of a photoresist in a region which belongs to the first p-type well layer 22 and in which the light-receiving region 23 is to be formed. Then, phosphorus ions and boron ions are successively implanted, so that an n-type impurity layer 38 and a p-type hole storage layer 39 are formed to constitute the light-receiving region 23. Subsequently, the aforementioned photoresist is removed.

Next, the silicon oxide film 29 is formed by CVD so as to provide insulation between the polysilicon gate electrode 28 and the light shielding film 30 to be subsequently formed. Further, a high-melting point metal TiW is deposited by sputtering as the light shielding film 30. Subsequently, a photoresist is formed, and an opening of the photoresist is provided on top of the light-receiving region 23 in both the effective pixel region A and the ineffective pixel region B. Then, the high-melting point metal TiW located on top of the light-receiving region 23 is removed by reactive ion etching, an opening portion 40 is formed.

Next, a BPSG film (silicon oxide film) 31 is deposited by CVD for flattening purpose. Further, an Al—Si film is deposited by sputtering in order to form the wiring metal film 32. The Al—Si film is covered with a photoresist. The photoresist in the ineffective pixel region A is removed as in the case of FIG. 1 or is opened on top of the light-receiving region 23 so as to take out the unnecessary Al—Si film by reactive ion etching. On the other hand, the Al—Si film in the ineffective pixel region B remains covered with the photoresist, and thereby the wiring metal film 32 is formed. Finally, P—SiN for the passivation film 33 is deposited by plasma CVD and a sintering process is conducted so as to complete the CCD area sensor of the present embodiment.

Figure 3:
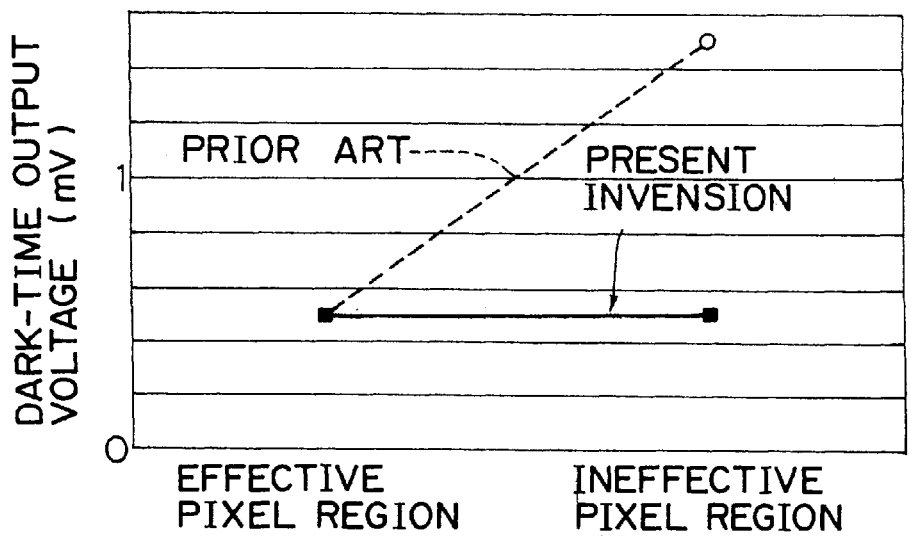
FIG. 3 is a graph showing a comparison between dark-time output voltages of the effective and ineffective pixel regions.

In the CCD area sensor formed as described above, as shown in FIG. 2, the opening portion 40 is provided in the light shielding film 30 on top of the light-receiving region 23 of the ineffective pixel region B. Therefore, the diffusion of hydrogen ions from the passivation film 33 formed of a P—SiN film toward the silicon substrate 21 is sufficiently effected in the subsequent hydrogen annealing process even though the light shielding film 30 is made of a material that is hard for hydrogen ions to penetrate, and the interface state densities of the light-receiving region 23 and the transfer channel region 24 are reduced. Therefore, as shown in FIG. 3, the dark-time output voltage of the ineffective pixel region B is reduced to be equivalent to the dark-time output voltage in the effective pixel region A.

That is, according to the present embodiment, no difference occurs between the effective pixel region A and the ineffective pixel region B in terms of the black level, and the black level can be stabilized in a dark environment and at the time of low-illumination image sensing.

Second Embodiment

In the aforementioned first embodiment, as shown in FIG. 2, the light shielding film 30 located on top of the light-receiving region 23 in the ineffective pixel region B is entirely covered with the wiring metal film 32 although it is provided with the opening portion 40. Therefore, if the wiring metal film 32 is formed of a material such as a barrier metal or a multilayer film including a TiN film, which is used as a reflection preventing film and is hard for hydrogen ions to penetrate, then the diffusion of hydrogen ions is impeded. The present embodiment copes with such a case.

Figure 4:
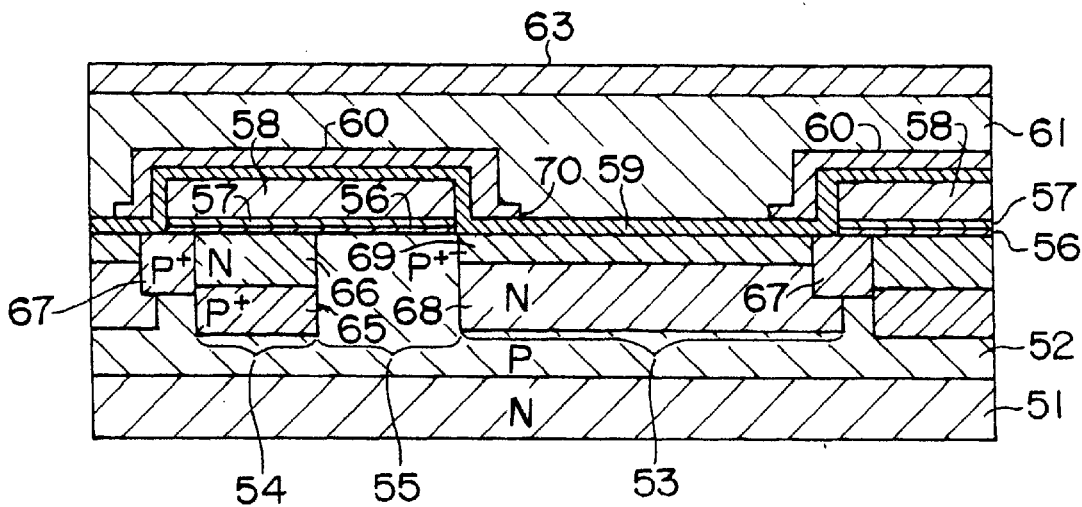
FIG. 4 is a sectional view of an effective pixel region in a CCD area sensor different from that of FIG. 1.
Figure 5:
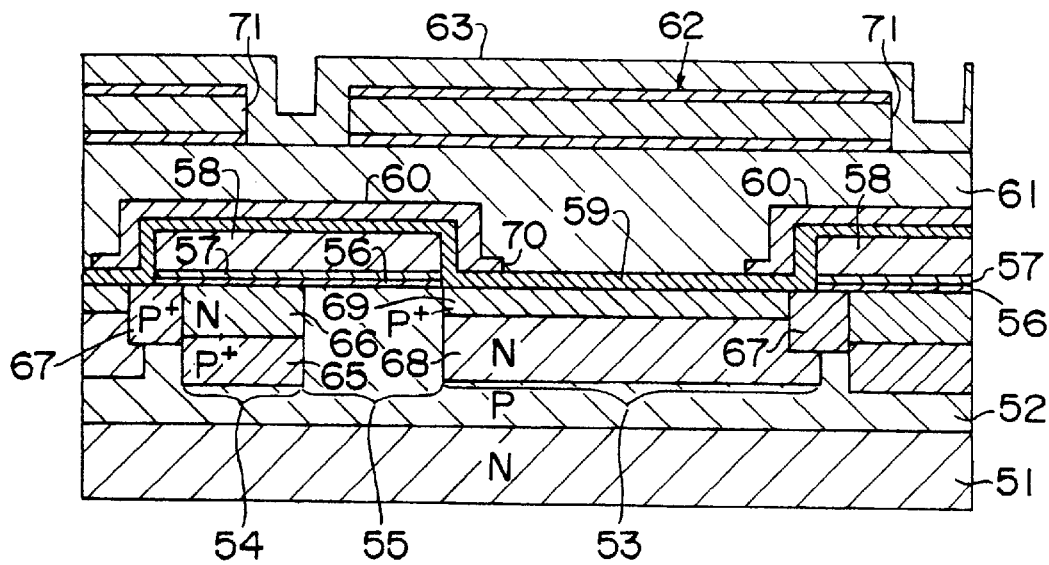
FIG. 5 is a sectional view of an ineffective pixel region corresponding to FIG. 4.

FIG. 4 shows a sectional view of the aforementioned effective pixel region A (corresponding to a cross section in the inner portion of the arrow line C–C' in FIG. 6) in a CCD area sensor of the present embodiment. FIG. 5 shows a sectional view of the ineffective pixel region B (corresponding to a cross section in the outer portion of the arrow line C–C' in FIG. 6). In FIG. 4 and FIG. 5 are shown an n-type semiconductor substrate 51, a first p-type impurity layer 52, a light-receiving region 53, a transfer channel section 54, a read gate region 55, a silicon oxide film 56 that serves as a gate insulating film, a silicon nitride film 57 that serves as a gate insulating film, a polysilicon gate electrode 58, a silicon oxide film 59 that covers the entire surface including the polysilicon gate electrode 58, a light shielding film 60 made of TiW, a silicon oxide film 61 of BPSG or the like for flattening and insulating uses, an wiring metal 62 made of a multilayer structure of TiN/Al—Cu/TiN film or the like which is used for a barrier metal or a reflection preventing film, and a passivation film 63 of P—SiN or the like. In this case, the light-receiving region 53 and the transfer channel region 54 are formed inside the first p-type impurity layer 52.

The CCD area sensor having the above-mentioned structure is formed as follows. First, boron ions are implanted into the entire surface of the n-type semiconductor substrate that serves as the n-type semiconductor substrate 51, and thereafter thermal diffusion is performed to form a first p-type well layer that serves as the first p-type impurity layer 52. Next, a window is opened by means of a photoresist in a region which belongs to the first p-type well layer 52 and in which the transfer channel region 54 is to be formed, and boron ions and phosphorus ions are successively implanted. A second p-type impurity layer (second p-type well layer) 65 and an n-type impurity layer 66 are thus formed to constitute the transfer channel region 54. After removing the photoresist, a window is opened by means of a photoresist in a region that belongs to the first p-type well layer 52 and is located between the transfer channel region 54 and the light-receiving region 53, and boron ions are implanted to form a p-type channel stop layer 67.

Next, after removing the photoresist, thermal oxidation is performed to form the silicon oxide film 56 that serves as a gate insulating film, and the silicon nitride film 57 is formed as a gate insulating film by CVD. Further, a polysilicon film is deposited by CVD, and thereafter, phosphorus doping is performed by the POCl₃ method. A region in which the polysilicon gate electrode 58 is to be formed is covered with a photoresist, and reactive ion etching is performed to remove the phosphorus doped polysilicon film and the silicon nitride film 57 for the formation of the polysilicon gate electrode 58. If the polysilicon gate electrode 58 is made to have a multilayer structure similarly to the case of the first embodiment, then photoresist removal, interlayer oxide film formation by thermal oxidation and polysilicon gate electrode formation of the next layer are repeated.

Next, a window is opened by means of a photoresist in a region which belongs to the first p-type well layer 52 and in which the light-receiving region 53 is to be formed, and phosphorus ions and boron ions are successively implanted. An n-type impurity layer 68 and a p-type hole storage layer 69 located on the light-receiving section surface are formed to constitute the light-receiving region 53. Subsequently, the aforementioned photoresist is removed.

Next, in order to provide insulation between the polysilicon gate electrode 58 and a light shielding film 60 to be subsequently formed, the silicon oxide film 59 is formed by CVD, and a high-melting point metal TiW is further deposited as a light shielding film 60 by sputtering. Subsequently, a photoresist is formed on the light shielding film 60, and an opening of the photoresist is provided on top of the light-receiving region 53 in each of the effective pixel region A and the ineffective pixel region B. The light shielding film 60 of TiW located on top of the light-receiving region 53 is removed by reactive ion etching, so that an opening portion 70 is formed.

Next, a BPSG film (silicon oxide film) 61 is deposited by CVD for flattening purpose. Further, a TiN/Al—Cu/TiN film is deposited by sputtering in order to form the wiring metal film 62. Then, a photoresist is deposited on the entire surface, and an opening is provided in a region other than just above the opening portion 70 in the ineffective pixel region B. The photoresist is removed or provided with an opening on top of the light-receiving region 23 in the effective pixel region A (the photoresist is removed in the case of FIG. 4), and the unnecessary TiN/Al—Cu/TiN film is removed by reactive ion etching to form the wiring metal film 62.

As described above, in the ineffective pixel region B of the present embodiment, the opening portion 71 is formed in the region of the wiring metal film 62 other than just above the opening portion 70. As the pixels are made finer in the CCD area sensor, there is often employed a multilayer of wiring metal films. TiN, which is used for the barrier metal and the material and the reflection preventing film, then obstructs diffusion of hydrogen ions during the hydrogen annealing in the next process. Accordingly, when the opening portion 71 is provided in a portion of the wiring metal film 62 other than just above the light-receiving region 53, the diffusion of hydrogen ions in the hydrogen annealing stage can be promoted while preventing light incident on the light-receiving region 53.

Finally, P—SiN is deposited as the passivation film 63 by plasma CVD and subjected to a sintering process to complete the CCD area sensor of the present embodiment.

According to the thus-formed CCD area sensor, as shown in FIG. 5, the light shielding film 60 is provided with the opening portion 70 on the light-receiving region 53 of the ineffective pixel region B. Furthermore, the wiring metal film 62 in the region other than just above the opening portion 70 is also provided with the opening portion 71. Therefore, in the subsequent hydrogen annealing process, sufficient diffusion of hydrogen ions is effected from the P—SiN passivation film 63 toward the silicon substrate 51 even though the light shielding film 30 is made of a material such as the high-melting point metal of TiW that is hard for hydrogen ions to penetrate and the wiring metal film 62 is made of a material such as TiN in the multilayer film, which is used as the barrier metal and the reflection preventing film and is hard for hydrogen ions to penetrate. Consequently, the interface state densities of the light-receiving region 53 and the transfer channel region 54 are reduced. Therefore, the dark-time output voltage of the ineffective pixel region B is reduced to be equivalent to the dark-time output voltage of the effective pixel region A.

That is, according to the present embodiment, no difference occurs between the effective pixel region A and the ineffective pixel region B in terms of the black level. Therefore, the black level can be stabilized in a dark environment and at the time of low-illumination image sensing.

It is to be noted that the wiring metal films 32 and 62 of the aforementioned embodiments are not necessarily be the metal film for wiring use. The CCD area sensor fabricating methods of the aforementioned embodiments are nothing but mere examples, and the formation procedure, the materials to be used, the film forming methods and so on are not limited to the aforementioned ones.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A solid state image sensing device that is separated into an effective pixel region for detecting optical information of a subject and an ineffective pixel region for detecting optical black and has a light-receiving section, a transfer channel section and a read section on an identical substrate, the device comprising:

a first light shielding film that covers the transfer channel section and the read section in the effective pixel region and the ineffective pixel region and is arranged so as to provide an opening on the light-receiving section;

an interlayer insulating film that is formed on the first light shielding film and the light-receiving section in the effective pixel region and the ineffective pixel region;

a second light shielding film that is formed on the interlayer insulating film in at least the ineffective pixel region and is arranged so as to cover the light-receiving section, the transfer channel section and the read section in at least the ineffective pixel region; and a protective insulating film that is formed on the interlayer insulating film and the second light shielding film to cover their entire surface in the effective pixel region and the ineffective pixel region.

2. A solid state image sensing device as claimed in claim 1, wherein
the second light shielding film is made of a metal film for wiring use.

3. A solid state image sensing device as claimed in claim 2, wherein
the metal film for wiring use is formed of a material that blocks penetration of hydrogen.

4. A solid state image sensing device as claimed in claim 2, wherein
the metal film for wiring use is formed of a laminate structure film that includes Ti or a Ti alloy.

5. A solid state image sensing device that has a light-receiving section, a transfer channel section and a read section on an identical substrate and is separated into an effective pixel region for detecting optical information of a subject and an ineffective pixel region for detecting optical black, the device comprising:
a first light shielding film that covers the transfer channel section and the read section in the effective pixel region and the ineffective pixel region and is arranged so as to provide an opening on the light-receiving section;
an interlayer insulating film formed on the first light shielding film and the light-receiving section in the effective pixel region and the ineffective pixel region;
a second light shielding film that is formed on the interlayer insulating film in at least the ineffective pixel region and is arranged so as to cover the light-receiving section and provide an opening in a region other than the light-receiving section; and
a protective insulating film that is formed on the interlayer insulating film and the second light shielding film to cover their entire surface in the effective pixel region and the ineffective pixel region.

6. A solid state image sensing device as claimed in claim 5, wherein
the second light shielding film is made of a metal film for wiring use.

7. A solid state image sensing device as claimed in claim 6, wherein
the metal film for wiring use is formed of a material that blocks penetration of hydrogen.

8. A solid state image sensing device as claimed in claim 6, wherein
the metal film for wiring use is formed of a laminate structure film that includes Ti or a Ti alloy.

* * * * *